US009177643B2

(12) United States Patent
Kim (10) Patent No.: US 9,177,643 B2
(45) Date of Patent: Nov. 3, 2015

(54) PHASE-CHANGE MEMORY DEVICE AND METHOD FOR MULTI-LEVEL PROGRAMMING OF PHASE-CHANGE MEMORY DEVICE

(71) Applicant: Intellectual Discovery Co., Ltd., Seoul (KR)

(72) Inventor: Deok Kee Kim, Seoul (KR)

(73) Assignee: Intellectual Discovery Co., Ltd., Seoul (KR)

( * ) Notice: Subject to any disclaimer, the term of this patent is extended or adjusted under 35 U.S.C. 154(b) by 0 days.

(21) Appl. No.: 14/225,203

(22) Filed: Mar. 25, 2014

(65) Prior Publication Data

US 2014/0293688 A1    Oct. 2, 2014

(30) Foreign Application Priority Data

Mar. 27, 2013    (KR) .......................... 10-2013-0032802

(51) Int. Cl.
*G11C 11/00* (2006.01)
*G11C 13/00* (2006.01)
*G11C 11/56* (2006.01)

(52) U.S. Cl.
CPC ........ *G11C 13/0069* (2013.01); *G11C 11/5678* (2013.01); *G11C 13/0004* (2013.01); *G11C 2211/5648* (2013.01)

(58) Field of Classification Search
USPC ..................................... 365/163, 148, 189.07
See application file for complete search history.

(56) References Cited

U.S. PATENT DOCUMENTS

| | | | | |
|---|---|---|---|---|
| 6,115,285 A | * | 9/2000 | Montanari et al. ........ | 365/185.03 |
| 7,450,415 B2 | * | 11/2008 | Kim et al. .................... | 365/163 |
| 7,639,526 B2 | * | 12/2009 | Pellizzer et al. ............. | 365/163 |
| 7,787,291 B2 | * | 8/2010 | Resta et al. .................. | 365/163 |
| 8,149,616 B2 | * | 4/2012 | Bedeschi et al. ............. | 365/163 |

FOREIGN PATENT DOCUMENTS

KR     10-2010-0009325     1/2010

* cited by examiner

*Primary Examiner* — Pho M Luu
(74) *Attorney, Agent, or Firm* — H.C. Park & Associates, PLC

(57) ABSTRACT

A method for multi-level programming of a phase change memory device includes selecting a word line from multiple word lines and applying multiple bits of data to a bit line of a cell connected to the selected word line. According to the type of data, the method applies a program current to the selected word line or a multi-level program current to word lines adjacent to the selected word line.

6 Claims, 3 Drawing Sheets

PHASE-CHANGE MEMORY DEVICE AND METHOD FOR MULTI-LEVEL PROGRAMMING OF PHASE-CHANGE MEMORY DEVICE

CROSS-REFERENCE TO RELATED APPLICATION

This application claims priority from and the benefit of Korean Patent Application No. 10-2013-0032802, filed on Mar. 27, 2013, which is incorporated by reference for all purposes as if set for the herein.

BACKGROUND

1. Field

The embodiments described herein pertain generally to a multi-level programming method of a phase-change memory device.

2. Discussion

A phase-change memory device (PRAM) among next-generation memory devices has the most excellent property and has been closest to mass production. Further, as compared with other memory devices, the PRAM is relatively simple in structure and manufacturing process and can be applied to both of a stand-alone memory and an embedded memory for SoC, and, thus, it has been regarded as one of ultimate memory devices.

However, in order to commercialize such a phase-change memory device, it is necessary to realize a multi-level cell capable of storing two or more bits of data in a cell as a minimum storage space of a memory for high integration.

The multi-level cell can store multiple bits of data per cell unlike a conventional single-level cell that stores one bit of data per cell, and, thus, it has an effect equivalent to reducing a physical size of the phase-change memory device.

In this regard, Korean Patent Laid-open Publication No. 10-2010-0009325 (entitled "Multi-level phase change random access memory device") describes a phase-change memory device that includes a phase-change material layer formed of a phase-change material having two different phases (two or more phases) and can store multiple bits of data in a cell.

SUMMARY

In view of the foregoing, example embodiments provide a multi-level programming method of a phase-change memory device capable of storing multiple levels in a cell for high integration of the phase-change memory device.

In a first aspect, there is provided a multi-level programming method of a phase-change memory device. The multi-level programming method comprises selecting a word line, where data are to be input, from multiple word lines; applying multiple bits of data to a bit line of a cell connected to the selected word line; applying a program current to the selected word line for programming of first data; applying a program current to the selected word line and applying a multi-level program current lower than the program current to one of word lines adjacent to the selected word line for programming of second data; and applying a program current to the selected word line and applying a multi-level program current lower than the program current to two of the word lines adjacent to the selected word line for programming of third data.

In a second aspect, there is provided a multi-level programming method of a phase-change memory device. The multi-level programming method of a phase-change memory device, the multi-level programming method comprises selecting a word line, where data are to be input, from multiple word lines; applying multiple bits of data to a bit line of a cell connected to the selected word line; applying a program current to the selected word line for programming of first data; applying a program current to the selected word line and applying a multi-level program current lower than the program current to one of bit lines adjacent to the bit line for programming of second data; and applying a program current to the selected word line and applying a multi-level program current lower than the program current to two of the bit lines adjacent to the bit line for programming of third data.

In a third aspect, there is provided a multi-level programming method of a phase-change memory device that includes, between word lines, a heater line extending in parallel with the word lines. The multi-level programming method comprises selecting a word line, where data are to be input, from multiple word lines; applying multiple bits of data to a bit line of a cell connected to the selected word line; applying a program current to the selected word line for programming of first data; applying a program current to the selected word line and applying a multi-level program current to one of heater lines adjacent to the selected word line for programming of second data; and applying a program current to the selected word line and applying a multi-level program current to two of the heater lines adjacent to the selected word line for programming of third data.

In a fourth aspect, there is provided a phase-change memory device comprising multiple phase-change memory cells that are formed at intersections of word lines and bit lines; and multiple heater lines that are formed between the word lines and extend in parallel with the word lines, wherein when a multi-level program operation is carried out with respect to a selected word line, a multi-level program current is applied to one or more heater lines adjacent to the selected word line.

In accordance with the various aspects, by changing an ambient temperature of a phase-change memory cell where data are to be stored, a program volume of a phase-change material layer is changed with multi-level resistance, so that it is possible to program multi-level data in a cell. The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION OF THE ILLUSTRATED EMBODIMENTS

Hereinafter, embodiments of the present disclosure will be described in detail with reference to the accompanying drawings so that the present disclosure may be readily implemented by those skilled in the art. However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "on" that is used to designate a position of one element with respect to another element includes both a case that the one element is adjacent to the another element and a case that any other element exists between these two elements.

Further, the term "comprises or includes" and/or "comprising or including" used in the document means that one or more other components, steps, operation and/or existence or addition of elements are not excluded in addition to the described components, steps, operation and/or elements unless context dictates otherwise. The term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

For reference, in the explanation of the example embodiments, the terms (upper side, lower side, etc.) related to directions or positions are defined with reference to arrangement of respective components illustrated in the drawings. By way of example, referring to FIG. 2, a top side may be an upper side and a bottom side may be a lower side. However, in various actual applications of the example embodiments, an upper side and a lower side may be arranged in opposite directions or in various directions.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Figure 1:
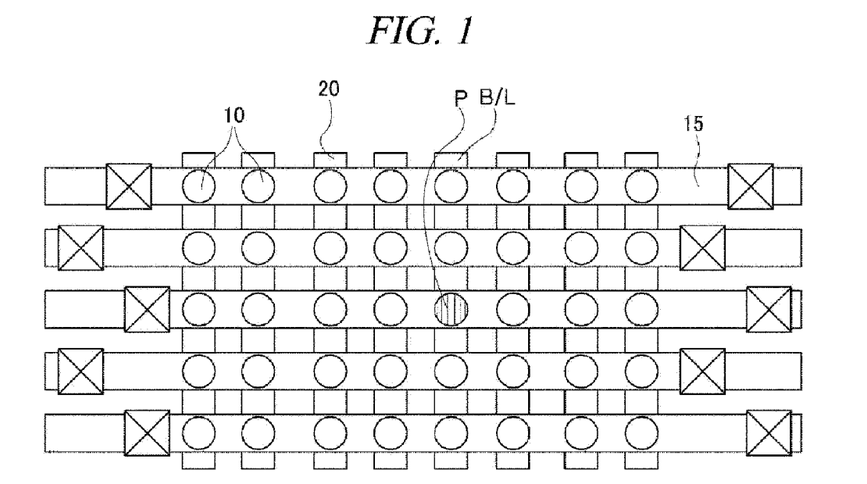
FIG. 1 is a plane view schematically showing a phase-change memory device.
Figure 2:
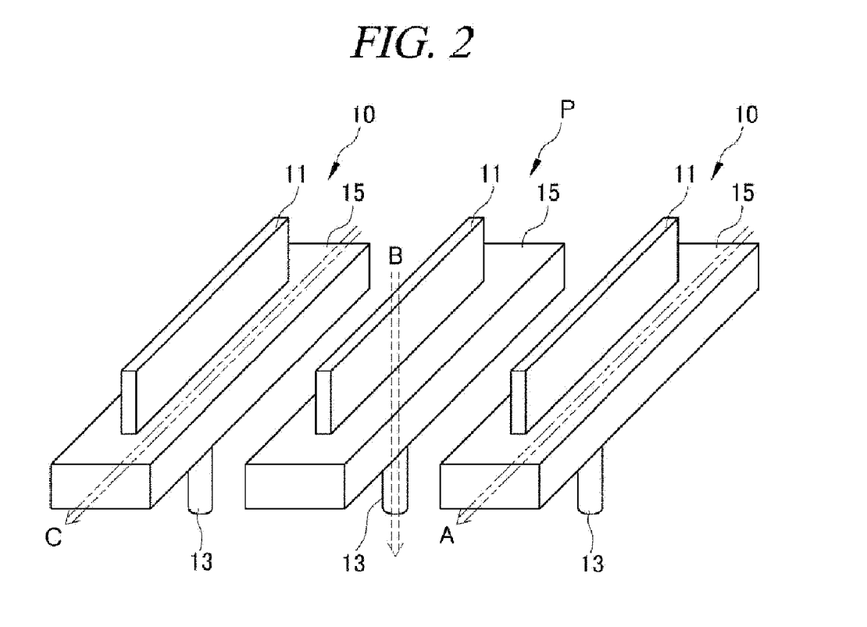
FIG. 2 is a conceptual diagram for explaining a multi-level programming method of a phase-change memory device in accordance with a first example embodiment.
Figure 3:
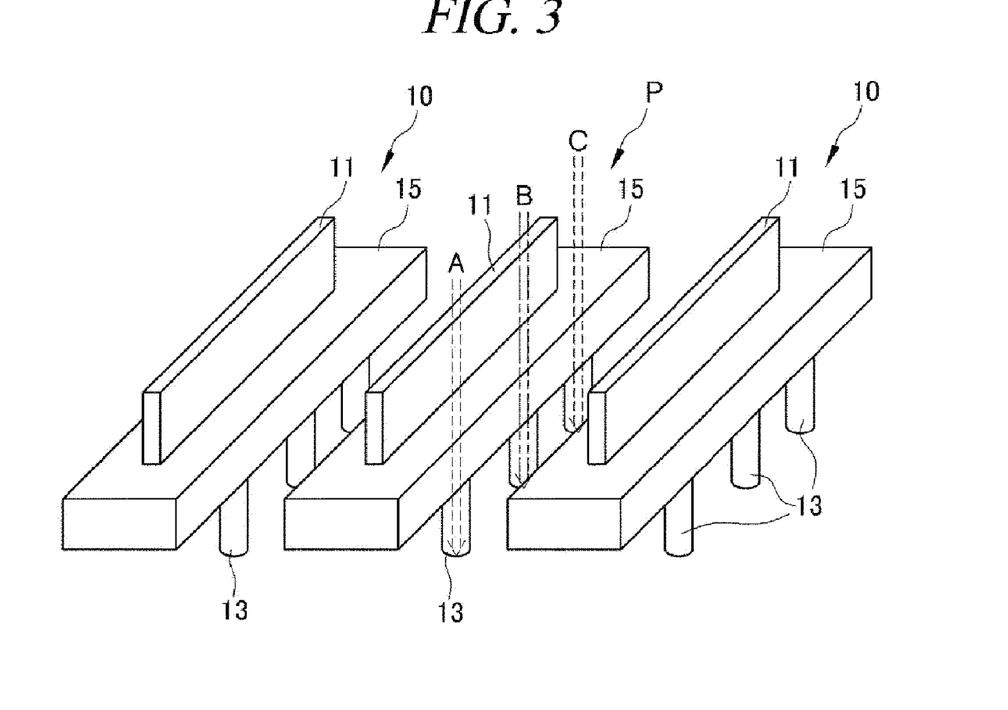
FIG. 3 is a conceptual diagram for explaining a multi-level programming method of a phase-change memory device in accordance with a second example embodiment.
Figure 4:
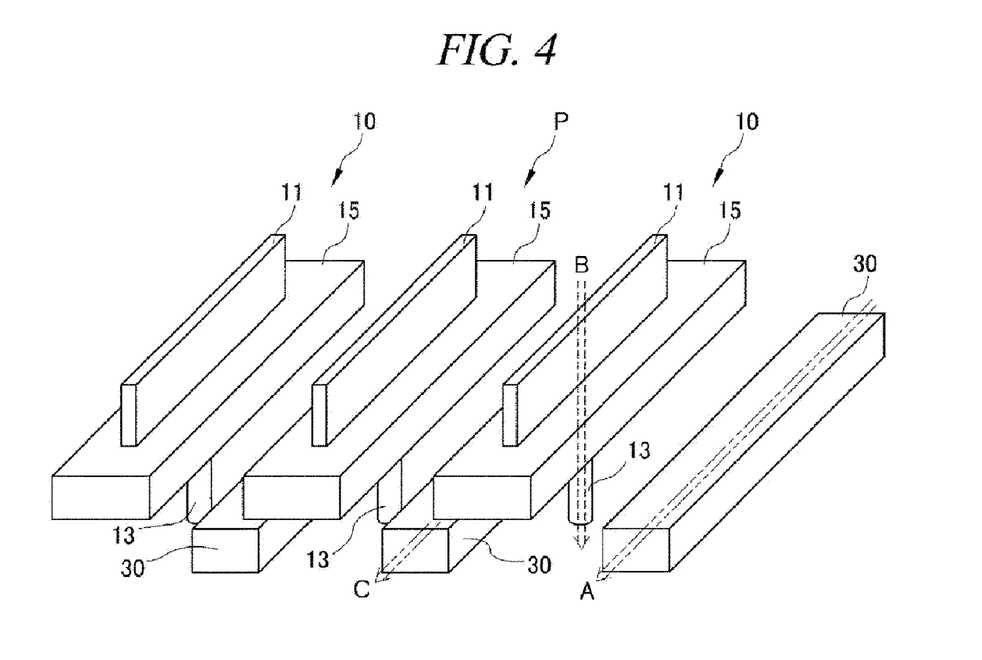
FIG. 4 is a conceptual diagram for explaining a multi-level programming method of a phase-change memory device in accordance with a third example embodiment.

FIG. 1 is a plane view schematically showing a phase-change memory device, and FIG. 2 to FIG. 4 are conceptual diagrams for explaining multi-level programming methods of a phase-change memory device in accordance with various example embodiments.

Firstly, a multi-level programming method of a phase-change memory device in accordance with a first example embodiment (hereinafter, referred to as "the multi-level programming method in accordance with the first example embodiment") will be explained hereinafter.

Referring to FIG. 1, a phase-change memory device may include multiple word lines (not illustrated), multiple bit lines 20, and multiple phase-change memory cells 10.

Further, the phase-change memory cell 10 may include an upper electrode 11, a lower electrode 13, and a phase-change material layer 15. In addition, the phase-change memory cell 10 may further include a switching device (not illustrated).

In this case, the switching device may be connected to the lower electrode 13 and can control an approach to a signal entering the phase-change material layer 15. Such a switching device may be, for example, a diode or a transistor.

The multi-level programming method in accordance with the first example embodiment includes selecting a word line (not illustrated), where data are to be input, from the multiple word lines.

The word line is provided to store data in the cell 10 and read the stored data.

By way of example, a word line connected to a cell P where data are to be stored is selected from the multiple cells 10.

The multi-level programming method in accordance with the first example embodiment includes applying multiple bits of data to a bit line (B/L in FIG. 1) of the cell P connected to the selected word line.

Thus, the bit line (B/L) of the cell P connected to the selected word line is activated to prepare for storing data in the cell P.

By way of example, referring to FIG. 1, in order to store data in the cell marked with "P", multiple bits of data are applied to the bit line (B/L) connected thereto.

The multi-level programming method in accordance with the first example embodiment includes applying a program current to the selected word line for programming of first data.

Thus, the phase-change material layer 15 of the cell P connected to the selected word line is changed in phase by a current (or a voltage), so that data can be stored in the cell P connected to the selected word line.

The multi-level programming method in accordance with the first example embodiment includes applying a program current to a selected word line and applying a multi-level program current lower than the program current to one of word lines adjacent to the selected word line for programming of second data.

Depending on a current (or a voltage) applied between the upper electrode 11 and the lower electrode 13 in the phase-change memory cell 10, a phase of the phase-change material in the phase-change material layer 15 may be changed. A conventional phase-change material has two distinct phases only such as an amorphous phase and a crystalline phase. Therefore, a phase-change memory cell including such a phase-change material can store only one bit of data. By way of example, an amorphous phase may be recognized as a digital signal "0", and a crystalline phase may be recognized as a digital signal "1".3

However, when the multi-level program current is applied to the selected word line and one of the adjacent word lines, an ambient temperature of the cell P connected to the selected word line is increased and a program volume of the phase-change material layer 15 included therein is changed. Therefore, a resistance of the phase-change material layer 15 is changed from a resistance in an amorphous phase or a resistance in a crystalline phase, so that multiple bits of data can be stored. By way of example, the program volume of the phase-change material layer 15 can be reduced as an ambient temperature is increased.

By way of example, in the case of a RESET operation, in order to store two bits, if a program current is applied to a selected word line only, data "11" can be stored in its corresponding cell P, and if a program current is applied to a selected word line while a multi-level program current is applied to one of word lines adjacent to the selected word line, data "10" can be stored in its corresponding cell P.

Referring to FIG. 2, if a program current is applied to a selected word line only (only a current B is applied), data "11" can be stored in the phase-change material layer 15. Further, if a program current is applied to a selected word line (a current B is applied) while a current is applied to one of word lines adjacent to the selected word line (only one of a current A and a current C is applied), data "10" can be stored in the phase-change material layer 15 in which the current B flows.

Herein, the multi-level program current may be lower than a current that changes a program state of the cell 10 connected to the word lines adjacent to the selected word line.

That is, desirably, the multi-level program current is a current that does not change a program state of the phase-change material layer 15 of the cell 10 connected to the adjacent word lines but changes a program volume of the phase-change material layer 15 of the cell P connected to the selected word line. This is not to affect data stored in the cells 10 other than the cell P connected to the selected word line.

Referring to FIG. 2, the current A or the current C may be a current that does not change a state of the phase-change material layer 15 in which the current flows.

The multi-level programming method in accordance with the first example embodiment includes applying a program current to a selected word line and applying a multi-level program current lower than the program current to two word lines adjacent to the selected word line.

When a current is applied to two of word lines adjacent to the selected word line, an ambient temperature of the cell P connected to the selected word line may be further increased as compared with the case where a current is applied to one word line. Therefore, a program volume of the phase-change material layer 15 of the cell P connected to the selected word line is changed in a different manner from the case where a current is applied to one of word lines adjacent to the selected word line. By way of example, a program volume may be further reduced in the case where a current is applied to two word lines as compared with the case where a current is applied to one word line.

Therefore, a resistance of the phase-change material layer 15 in the case where a multi-level program current is applied to two of word lines adjacent to the selected word line is changed from a resistance in an amorphous phase, a resistance in a crystalline phase, and a resistance in the case where a current is applied to one word line, so that multiple bits of data can be stored.

In the case of a RESET operation, in order to store two bits, if a program current is applied to a selected word line only, data "11" can be stored in its corresponding cell P, and if a program current is applied to a selected word line while a multi-level program current is applied to two adjacent word lines, data "01" can be stored in its corresponding cell P.

Referring to FIG. 2, if a program current is applied to a selected word line only (only a current B is applied), data "11" can be stored in the phase-change material layer 15. Further, if a program current is applied to a selected word line (a current B is applied) while a current is applied to two of word lines adjacent to the selected word line (both of a current A and a current C are applied), data "01" can be stored in the phase-change material layer 15 in which the current B flows.

Herein, as explained above, the multi-level program current may be lower than a current that changes a program state of the word lines adjacent to the selected word line.

As explained above, this is not to affect data stored in the other cells 10. Referring to FIG. 2, the current A and the current C may be currents that do not change a state of the phase-change material layer 15 in which the currents flow.

A multi-level programming method of a phase-change memory device in accordance with a second example embodiment (hereinafter, referred to as "the multi-level programming method in accordance with the second example embodiment") will be explained hereinafter. However, components identical or similar to those explained above in the multi-level programming method in accordance with the first example embodiment will be assigned identical reference numerals, and explanation thereof will be briefly provided or omitted.

The multi-level programming method in accordance with the second example embodiment includes selecting a word line, where data are to be input, from multiple word lines.

As explained above, a word line connected to the cell P where data are to be stored is selected from the multiple cells 10.

The multi-level programming method in accordance with the second example embodiment includes applying multiple bits of data to a bit line (B/L) of the cell P connected to the selected word line.

By way of example, referring to FIG. 1, in order to store data in the cell marked with "P", multiple bits of data are applied to the bit line (B/L) connected thereto.

The multi-level programming method in accordance with the second example embodiment includes applying a program current to the selected word line for programming of first data.

Thus, the phase-change material layer 15 of the cell P connected to the selected word line is changed in phase by a current (or a voltage), so that data can be stored in the cell P connected to the selected word line.

The multi-level programming method in accordance with the second example embodiment includes applying a program current to a selected word line and applying a multi-level program current lower than the program current to one of bit lines 20 adjacent to the bit line (B/L) for programming of second data.

As explained above, when an ambient temperature of the cell P connected to the selected word line is increased, a program volume of the phase-change material layer 15 included therein is changed. Therefore, a resistance of the phase-change material layer 15 is changed from a resistance in an amorphous phase or a resistance in a crystalline phase, so that multiple bits of data can be stored.

In the multi-level programming method in accordance with the first example embodiment, in order to change the ambient temperature of the cell P connected to the selected word line, a multi-level program current is applied to a word line adjacent to the selected word line.

Meanwhile, in the multi-level programming method in accordance with the second example embodiment, in order to change the ambient temperature of the cell P connected to the selected word line, a multi-level program current is applied to the bit line 20 adjacent to the bit line (B/L) connected to the cell P where data are to be stored.

Referring to FIG. 3, if a program current is applied to a selected word line only (only a current B is applied), data "11" can be stored in the phase-change material layer 15. Further, if a program current is applied to a selected word line (a current B is applied) while a current is applied to one of bit lines 20 adjacent to the bit line (B/L) connected to the cell P to which the current B is applied (only one of a current A and a current C is applied), data "10" can be stored in the phase-change material layer 15 in which the current B flows.

Herein, desirably, the multi-level program current to be applied to the adjacent bit lines 20 is lower than a current for writing or reading data in the cell 10 to which the multi-level program current is applied. This is not to affect data stored in the cells 10 other than the cell P connected to the selected word line.

By way of example, the multi-level program current may be about 1 µA or less.

The multi-level programming method in accordance with the second example embodiment includes applying a program current to a selected word line and applying a multi-level program current lower than the program current to two of the bit lines 20 adjacent to the bit line (B/L) for programming of third data.

When a current is applied to two of the bit lines adjacent to the bit line (B/L) connected to the cell P where data are to be stored, an ambient temperature of the cell P where data are to be stored may be further increased as compared with the case where a current is applied to one bit line 20. Therefore, a program volume of the phase-change material layer 15 of the cell P where data are to be stored is changed in a different manner from the case where a current is applied to one of the bit lines 20 adjacent to the bit line (B/L) connected to the cell P. By way of example, a program volume may be further reduced in the case where a current is applied to two bit lines 20 as compared with the case where a current is applied to one bit line 20.

Therefore, a resistance of the phase-change material layer 15 in the case where a multi-level program current is applied to two of the adjacent bit lines 20 is changed from a resistance in an amorphous phase, a resistance in a crystalline phase, and a resistance in the case where a current is applied to one of the adjacent bit lines 20, so that multiple bits of data can be stored.

In the case of a RESET operation, in order to store two bits, if a program current is applied to a selected word line only, data "11" can be stored in its corresponding cell P, and if a program current is applied to a selected word line while a multi-level program current is applied to two adjacent bit lines 20, data "01" can be stored in its corresponding cell P.

Referring to FIG. 3, if a program current is applied to a selected word line only (only a current B is applied), data "11" can be stored in the phase-change material layer 15. Further, if a program current is applied to a selected word line (a current B is applied) while a current is applied to two adjacent bit lines 20 (both of a current A and a current C are applied), data "01" can be stored in the phase-change material layer 15 in which the current B flows.

A multi-level programming method of a phase-change memory device in accordance with a third example embodiment (hereinafter, referred to as "the multi-level programming method in accordance with the third example embodiment") will be explained hereinafter. However, components identical or similar to those explained above in the multi-level programming method in accordance with the first example embodiment will be assigned identical reference numerals, and explanation thereof will be briefly provided or omitted.

In this case, the phase-change memory device includes, between word lines, a heater line 30 extending in parallel with the word lines.

As explained above, by increasing an ambient temperature of a cell P where data are to be stored, multiple bits can be stored. In order to increase an ambient temperature of the cell P as such, a current is applied to the heater line 30 formed to be adjacent to a word line in the multi-level programming method in accordance with the third example embodiment. Details thereof will be described later.

In this case, the heater line 30 may be formed in the same process in which a typical tungsten plug included in a phase-change memory device is formed. Therefore, an additional process for forming the heater line 30 is not needed.

By way of example, the heater line 30 may include pure metals such as W or the like, or metal alloys such as TiN, TaN, TSN, or the like. However, materials of the heater line 30 are not limited thereto.

Further, the heater line 30 may be positioned under the cell P connected to the selected word line as depicted in FIG. 4, but may not be limited thereto, and may be positioned next to or above the cell P.

The multi-level programming method in accordance with the third example embodiment includes selecting a word line where data are to be input from multiple word lines.

As explained above, a word line connected to a cell P where data are to be stored is selected from multiple cells 10.

The multi-level programming method in accordance with the third example embodiment includes applying multiple bits of data to a bit line (B/L) of the cell P connected to the selected word line.

By way of example, referring to FIG. 1, in order to store data in the cell marked with "P", multiple bits of data are applied to the bit line (B/L) connected thereto.

The multi-level programming method in accordance with the third example embodiment includes applying a program current to the selected word line for programming of first data.

Thus, a phase-change material layer 15 of the cell P connected to the selected word line is changed in phase by a current (or a voltage), so that data can be stored in the cell P connected to the selected word line.

The multi-level programming method in accordance with the third example embodiment includes applying a program current to a selected word line and applying a multi-level program current to one of heater lines 30 adjacent to the selected word line for programming of second data.

As explained above, when an ambient temperature of a cell P connected to the selected word line is increased, a program volume of the phase-change material layer 15 included therein is changed. Therefore, a resistance of the phase-change material layer 15 is changed from a resistance in an amorphous phase or a resistance in a crystalline phase, so that multiple bits of data can be stored.

In this regard, in the multi-level programming method in accordance with the first example embodiment, an ambient temperature of the cell P connected to the selected word line is increased by applying a multi-level program current to the word line adjacent to the selected word line, and in the multi-level programming method in accordance with the second example embodiment, an ambient temperature of the cell P connected to the selected word line is increased by applying a multi-level program current to the bit line 20 adjacent to the bit line (B/L) connected to the cell P where data are to be stored.

Meanwhile, in the multi-level programming method in accordance with the third example embodiment, an ambient temperature of the cell P connected to the selected word line is increased by providing the heater line 30 extending in parallel with word lines of the phase-change memory device between the word lines, and applying a current to the heater line 30.

Referring to FIG. 4, if a program current is applied to a selected word line only (only a current B is applied), data "11" can be stored in the phase-change material layer 15. Further, if a program current is applied to a selected word line (a current B is applied) while a current is applied to one of heater lines 30 adjacent to a word line connected to the cell P to which the current B is applied (a current A or a current C is applied), data "10" can be stored in the phase-change material layer 15 in which the current B flows.

In this case, the multi-level program current to be applied to the heater line 30 is not limited in magnitude of the current unlike the multi-level programming methods in accordance with the first and second example embodiments. This is because the heater line 30 is separately provided without being connected to the cell P, and, thus, regardless of magnitude, a multi-level program current applied to the heater line 30 does not affect data stored in the other cells 10. Therefore, it is possible to more easily program multiple levels.

The multi-level programming method in accordance with the third example embodiment includes applying a program current to a selected word line and applying a multi-level program current to two of the heater lines 30 adjacent to the selected word line for programming of third data.

When a current is applied to two of the heater lines 30 adjacent to the selected word line, an ambient temperature of the cell P where data are to be stored may be further increased as compared with the case where a current is applied to one heater line 30. Therefore, a program volume of the phase-change material layer 15 of the cell P where data are to be stored is changed in a different manner from the case where a current is applied to one heater line 30. By way of example, a program volume may be further reduced as compared with the case where a current is applied to one heater line 30.

Therefore, a resistance of the phase-change material layer 15 in the case where a multi-level program current is applied to two of the adjacent heater lines 30 is changed from a resistance in an amorphous phase, a resistance in a crystalline phase, and a resistance in the case where a current is applied to one heater line 30, so that multiple bits of data can be stored.

In the case of a RESET operation, in order to store two bits, if a program current is applied to a selected word line only (only a current B is applied), data "11" can be stored in its corresponding cell P, and if a program current is applied to a selected word line (a current B is applied) while a multi-level program current is applied to two adjacent heater lines 30 (both of a current A and a current C in FIG. 4 are applied), data "01" can be stored in its corresponding cell P.

Hereinafter, a phase-change memory device (hereinafter, referred to as "the present phase-change memory device") in accordance with an example embodiment will be explained. However, components identical or similar to those explained above in the multi-level programming methods in accordance with the first to third example embodiments will be assigned identical reference numerals, and explanation thereof will be briefly provided or omitted.

The present phase-change memory device includes multiple phase-change memory cells 10.

The phase-change memory cell 10 is formed at an intersection of a word line and a bit line 20.

The phase-change memory cell 10 may include an upper electrode 11, a lower electrode 13, and a phase-change material layer 15. In addition, the phase-change memory cell 10 may further include a switching device (not illustrated).

In this case, the switching device may be connected to the lower electrode 13 and can control an approach to a signal entering the phase-change material layer 15. Such a switching device may be, for example, a diode or a transistor.

The present phase-change memory device includes multiple heater lines 30.

The heater line 30 is formed between word lines and extends in parallel with the word lines.

By way of example, the heater line 30 may be positioned under a cell P connected to a selected word line as depicted in FIG. 4, but may not be limited thereto, and may be positioned next to or above the cell P.

In the present phase-change memory device, during a multi-level program operation with respect to a selected word line, a multi-level program current is applied to one or more heater lines 30 adjacent to the selected word line.

As explained above, by increasing an ambient temperature of a cell P where data are to be stored, multiple bits can be stored. The present phase-change memory device includes the heater lines 30 and allows a multi-level program current flow to the heater lines 30 to increase an ambient temperature of the cell P, so that multiple bits can be stored.

In this case, the multi-level program current to be applied to the heater line 30 is not limited in magnitude of the current. This is because the heater line 30 is separately provided without being connected to the cell P, and, thus, regardless of magnitude, a multi-level program current applied to the heater line 30 does not affect data stored in the other cells 10. Therefore, it is possible to more easily program multiple levels.

After multiple bits of data are applied to a bit line (B/L) of a phase-change memory cell P connected to a selected word line, if a program current is applied to the selected word line, first data can be programmed in the phase-change memory cell P connected to the selected word line.

As explained above, in the case of a RESET operation, in order to store two bits, if a program current is applied to a selected word line only (only a current B in FIG. 4 is applied), data "11" can be stored in the phase-change material layer 15.

Further, if a program current is applied to a selected word line and a multi-level program current is applied to any one of the heater lines 30 adjacent to the selected word line, second data can be programmed in the phase-change memory cell P connected to the selected word line.

By way of example, referring to FIG. 4, if a program current is applied to a selected word line (a current B is applied) and a current is applied to any one of the heater lines 30 adjacent to a word line connected to the cell P to which the current B is applied (a current A or a current C is applied), data "10" can be stored in the phase-change material layer 15 in which the current B flows.

Furthermore, if a program current is applied to a selected word line and a multi-level program current is applied to two of the heater lines 30 adjacent to the selected word line, third data can be programmed in the phase-change memory cell P connected to the selected word line.

By way of example, referring to FIG. 4, if a program current is applied to a selected word line only (only a current B is applied), data "11" can be stored in its corresponding cell P, and if a program current is applied to a selected word line (a current B is applied) while a multi-level program current is applied to two adjacent heater lines 30 (both of a current A and a current C are applied), data "01" can be stored in its corresponding cell P.

In this case, the heater line 30 may be formed during a process for forming a plug provided in the phase-change memory device.

That is, the heater line 30 may be formed in the same process in which a typical tungsten plug included in a phase-change memory device is formed. Therefore, an additional process for forming the heater line 30 is not needed.

By way of example, the heater line 30 may include pure metals such as W or the like, or metal alloys such as TiN, TaN, TSN, or the like. However, materials of the heater line 30 are not limited thereto.

In accordance with the multi-level programming methods of a phase-change memory device in accordance with the first to third example embodiments, by changing an ambient temperature of a phase-change memory cell where data are to be stored, a program volume of a phase-change material layer is changed with multi-level resistance, so that it is possible to program multi-level data in a cell. Thus, it is possible to improve a density with respect to the same chip area in a phase-change memory device.

In accordance with the multi-level programming methods of a phase-change memory device in accordance with the first and second example embodiments, by applying a multi-level program current to each of a word line and a bit line 20 conventionally provided, two or more bits of data can be stored in a cell P. Thus, it is possible to realize a multi-level cell without additional components. Since a multi-level cell is realized by using components conventionally provided, there is no increase in chip area. Therefore, a phase-change memory device can be further highly integrated.

Further, in accordance with the multi-level programming method of a phase-change memory device in accordance with the third example embodiment, heater lines 30 are separately provided in order not to affect data stored in a cell P. Therefore, a multi-level program current is not limited in magnitude unlike the first and second example embodiments in which a multi-level program current is limited in magnitude. Therefore, it is possible to more easily program multiple levels as compared with the multi-level programming methods in accordance with the first and second example embodiments. Furthermore, since the heater lines 30 can be formed by using a process for forming a tungsten plug of the phase-change memory device, the heater lines 30 can be easily formed without an additional process.

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

What is claimed is:

1. A multi-level programming method of a phase-change memory device, the multi-level programming method comprising:
   selecting a word line, where data are to be input, from multiple word lines;
   applying multiple bits of data to a bit line of a cell connected to the selected word line;
   applying a program current to the selected word line for programming of first data;
   applying a program current to the selected word line and applying a multi-level program current lower than the program current to one of word lines adjacent to the selected word line for programming of second data; and
   applying a program current to the selected word line and applying a multi-level program current lower than the program current to two of the word lines adjacent to the selected word line for programming of third data,
   wherein an ambient temperature of the cell is increased by the multi-level program current and a program volume of a phase-change material layer of the cell is reduced as the ambient temperature is increased, such that a program state of the cell is classified based on the program volume of the phase-change material layer of the cell.

2. The multi-level programming method of claim 1, wherein the multi-level program current is lower than a current that changes a program state of a cell connected to the word lines adjacent to the selected word line.

3. A multi-level programming method of a phase-change memory device, the multi-level programming method comprising:
   selecting a word line, where data are to be input, from multiple word lines;
   applying multiple bits of data to a bit line of a cell connected to the selected word line;
   applying a program current to the selected word line for programming of first data;
   applying a program current to the selected word line and applying a multi-level program current lower than the program current to one of bit lines adjacent to the bit line for programming of second data; and
   applying a program current to the selected word line and applying a multi-level program current lower than the program current to two of the bit lines adjacent to the bit line for programming of third data,
   wherein an ambient temperature of the cell is increased by the multi-level program current and a program volume of a phase-change material layer of the cell is reduced as the ambient temperature is increased, such that a program state of the cell is classified based on the program volume of the phase-change material layer of the cell.

4. A multi-level programming method of a phase-change memory device that includes, between word lines, a heater line extending in parallel with the word lines, the multi-level programming method comprising:
   selecting a word line, where data are to be input, from multiple word lines;
   applying multiple bits of data to a bit line of a cell connected to the selected word line;
   applying a program current to the selected word line for programming of first data;
   applying a program current to the selected word line and applying a multi-level program current to one of heater lines adjacent to the selected word line for programming of second data; and
   applying a program current to the selected word line and applying a multi-level program current to two of the heater lines adjacent to the selected word line for programming of third data,
   wherein an ambient temperature of the cell is increased by the multi-level program current and a program volume of a phase-change material layer of the cell is reduced as the ambient temperature is increased, such that a program state of the cell is classified based on the program volume of the phase-change material layer of the cell.

5. The phase-change memory device of claim 4, wherein the heater lines are formed during a process for forming a plug provided in the phase-change memory device.

6. The phase-change memory device of claim 4, wherein the heater lines are formed between the word lines and extend in parallel with the word lines.

\* \* \* \* \*